(12) United States Patent
Murayama

(10) Patent No.: US 7,376,043 B2
(45) Date of Patent: May 20, 2008

(54) INTERFACE CIRCUIT

(75) Inventor: Tohru Murayama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/499,692

(22) Filed: Aug. 7, 2006

(65) Prior Publication Data

US 2007/0058478 A1  Mar. 15, 2007

(30) Foreign Application Priority Data

Sep. 6, 2005 (JP) .............................. 2005-258126

(51) Int. Cl.
  *G11C 7/00* (2006.01)
  *G11C 8/00* (2006.01)
(52) U.S. Cl. ...................... 365/233; 365/194
(58) Field of Classification Search ................ 365/233, 365/194, 189.05, 226, 230.08
  See application file for complete search history.

(56) References Cited

U.S. PATENT DOCUMENTS

| | | | | |
|---|---|---|---|---|
| 5,896,347 A | * | 4/1999 | Tomita et al. ............... | 365/233 |
| 5,995,424 A | * | 11/1999 | Lawrence et al. ........... | 365/233 |
| 6,131,149 A | * | 10/2000 | Lu et al. ...................... | 365/233 |
| 6,166,990 A | * | 12/2000 | Ooishi et al. ................ | 365/233 |
| 6,449,213 B1 | * | 9/2002 | Dodd et al. .................. | 365/233 |
| 6,980,480 B2 | * | 12/2005 | Choi ........................... | 365/233 |
| 7,181,639 B2 | * | 2/2007 | Chua-Eoan et al. ......... | 365/233 |
| 7,227,809 B2 | * | 6/2007 | Kwak .......................... | 365/233 |
| 7,239,575 B2 | * | 7/2007 | Kim ............................ | 365/233 |
| 7,251,194 B2 | * | 7/2007 | Lin et al. ..................... | 365/233 |

\* cited by examiner

*Primary Examiner*—Trong Phan
(74) *Attorney, Agent, or Firm*—Young & Thompson

(57) ABSTRACT

An interface circuit includes: a first synchronizing circuit for synchronizing a signal having a delay equal to or more than a predetermined period with respect to a reference clock, with the reference clock; a second synchronizing circuit for synchronizing a signal having a delay less than the predetermined period with respect to the reference clock, with the reference clock; a delay determining circuit for outputting a determination signal based on a delay of the signal relative to the reference clock; a delay determination setting circuit for outputting a path setting signal that designates an output value of one of the first synchronizing circuit and the second synchronizing circuit based on a preset value; and a delay selecting circuit for selecting and outputting an output value of one of the first synchronizing circuit and the second synchronizing circuit based on one of the determination signal and the path setting signal.

17 Claims, 8 Drawing Sheets

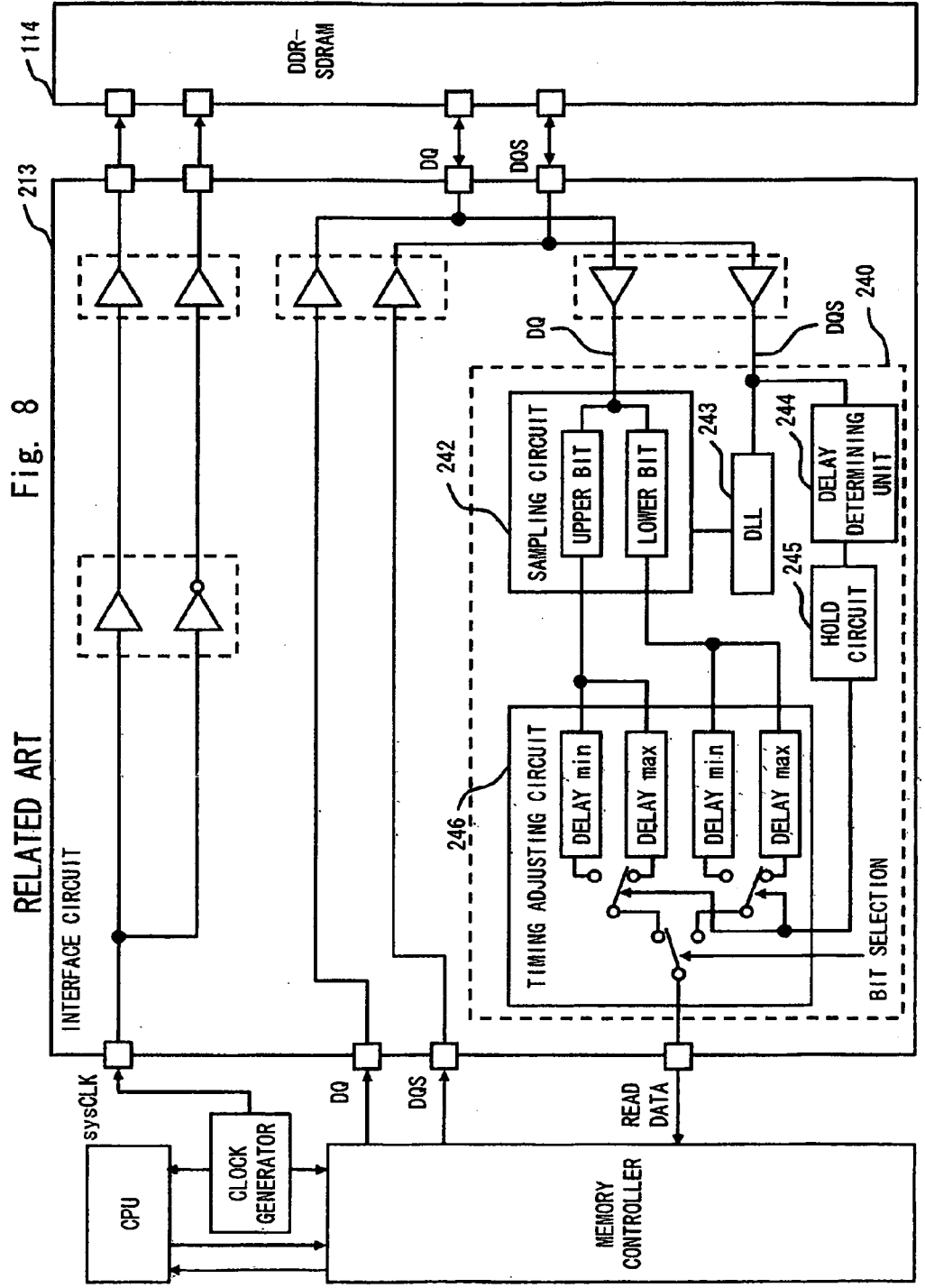

INTERFACE CIRCUIT

BACKGROUND OF THE INVENTION

1. Field of the Invention

The present invention relates to an interface circuit, and more particularly to an interface circuit that sends data, which has been applied to a block not in sync with a system clock, toward another block in sync with the system clock.

2. Description of Related Art

In the case of configuring a system using plural functional circuits, there is a possibility that the functional circuits receive/transmit data not synchronized with a system clock. In such a case, it is necessary to provide an interface circuit including a synchronizing circuit for synchronizing the data asynchronous with the system clock with the system clock. As an example of the interface circuit, there is an interface circuit provided between a mobile DDR-SDRAM (Double Data Rate-Synchronous Dynamic Random Access Memory) and a memory controller. FIG. 6 is a block diagram showing a data processing system 100 including an interface circuit of the Related Art 1.

As shown in FIG. 6, the data processing system 100 of the Related Art 1 includes a CPU 110, a clock generator 111, a memory controller 112, an interface circuit 113, and a DDR-SDRAM 114.

Each block of the data processing system 100 operates in response to a reference clock (for example, sysCLK) generated with the clock generator 111. The CPU 110 processes data based on a command of an application stored in a storage device or the like (not shown). Further, the CPU 110 transmits/receives data to/from the memory controller 112 and to/from the DDR-SDRAM 114 through the interface circuit 113 as needed.

Upon the data transmission/reception, the DDR-SDRAM 114 transmits data DQ in sync with a strobe signal DQS asynchronous with a system clock sysCLK. However, the memory controller 112 cannot accurately receive the data unless the data is synchronized with the system clock sysCLK. To that end, the interface circuit 113 accurately receives the data DQ from the DDR-SDRAM 114, converts the data DQ into read data that can be accurately received by the memory controller 112 to change a synchronous timing, and transmits the read data to the memory controller 112. That is, the interface circuit 113 arbitrates between blocks that operate at different synchronous timings.

The interface circuit 113 adjusts a signal synchronous timing with a read data synchronizing unit 140 incorporated in the interface circuit 113. The synchronous timing is adjusted as follows. The read data synchronizing unit 140 includes a DLL (Delay Locked Loop) circuit 142, a sampling circuit 143 (includes flip-flop FF10 and FF11), a synchronizing circuit 144 (includes flip-flop FF12 and FF13), and a read data synchronizing unit 145.

First, when receiving the strobe signal DQS and the data DQ from the DDR-SDRAM 114, the DLL 142 gives a predetermined delay time (for example, a phase lag of 90°) to the strobe signal to generate a delayed strobe signal D_DQS. Next, the sampling circuit 143 samples the data DQ based on the delayed strobe signal D_DQS. At this time, since the data DQ is sampled based on the delayed strobe signal D_DQS, it is possible to sample the data in a period in which the data is stabilized, not changed.

Next, the synchronizing circuit 144 latches the data sampled with the sampling circuit 143 in response to the system clock sysCLK. Hence, the data DQ becomes a signal synchronous with the system clock sysCLK. A read data output unit adjusts a bit length of the data DQ synchronized with the system clock sysCLK by the synchronizing circuit 144 to output the adjusted data as read data to the memory controller 112.

However, the interface circuit 113 and the DDR-SDRAM 114 are generally mounted onto different semiconductor substrates, that is, embedded in different chips. Thus, the interface circuit 113 and the DDR-SDRAM 114 are connected through a line with some length, so a delay occurs in a signal transmitted/received on the line due to a resistance or capacitance of the line.

The interface circuit 113 of the Related Art 1 has a problem in that arbitration cannot be accurately executed depending on a delay of the strobe signal with respect to the system clock sysCLK. The operation of this case is explained below. FIG. 7 is a timing chart in the case where the strobe signal DQS is given a large delay relative to the system clock sysCLK, and the case where the strobe signal DQS is given a small delay relative to the system clock sysCLK.

As shown in FIG. 7, in the interface circuit of the Related Art 1, if the synchronizing circuit 144 is set to latch data [a] Lower, [a] Upper, [b] Lower, and [b] Upper inputted in synchronization with the strobe signal DQS and sampled with the sampling circuit 143 on the rising edge of the system clock sysCLK on the assumption that the strobe signal DQS has a large delay relative to the system clock sysCLK, when the input strobe signal DQS has a small delay relative to the system clock sysCLK, the synchronizing circuit 144 cannot latch lower-bit data [b] Lower of the data DQ (timing Tb).

Further, if the synchronizing circuit 144 is set to latch data [a] Lower, [a] Upper, [b] Lower, and [b] Upper inputted in synchronization with the strobe signal DQS and sampled with the sampling circuit 143 on the falling edge of the system clock sysCLK on the assumption that the strobe signal DQS has a small delay relative to the system clock sysCLK, when the input strobe signal DQS has a large delay relative to the system clock sysCLK, the synchronizing circuit 144 cannot latch upper-bit data [a] Upper of the data DQ (timing Ta).

That is, the interface circuit 113 of the Related Art 1 cannot execute accurate arbitration depending on a delay of the strobe signal DQS with respect to the system clock sysCLK.

Japanese Unexamined Patent Application Publication No. 2005-78547 discloses a technique for solving the above problem (Related Art 2). FIG. 8 shows an interface circuit 213 of the Related Art 2.

A sampling circuit 242 of a read data generating unit 240 of the interface circuit 213 of the Related Art 2 latches data DQ using a strobe signal DQS delayed by a DLL 243 similarly to the Related Art 1. The data DQ latched by the sampling circuit 242 is synchronized with the system clock sysCLK by a timing adjusting circuit 246 and then output to the memory controller 212.

A timing adjusting circuit 246 of the interface circuit 213 of the Related Art 2 has two data synchronizing paths (delay max and delay min) corresponding to different delay times. An appropriate one of the two paths is selected depending on a delay of the strobe signal DQS relative to the system clock sysCLK to thereby output the data DQ of the selected synchronizing path.

A delay determining circuit 244 determines a delay of the strobe signal DQS relative to the system clock sysCLK, and a hold circuit 245 holds the determination result of the delay determining circuit 244. The timing adjusting circuit 246 selects based on a bit selection signal and outputs the data DQ on the delay-max path for a large delay and selects based on the bit selection signal and outputs the data DQ on the delay-min path for a small delay based on the information stored in the hold circuit 245.

The timing adjusting circuit 246 of the interface circuit 213 of the Related Art 2 has tow data synchronizing paths corresponding to different delay times, and the delay determining circuit 244 determines the delay of the strobe signal DQS relative to the system clock sysCLK. Based on the result of determining the delay, the timing adjusting circuit 246 selects the synchronizing path corresponding to the determined delay to output the data DQ on the selected path. As a result, the interface circuit 213 of the Related Art 2 can accurately synchronize the data DQ with the system clock sysCLK regardless of whether the strobe signal DQS has a large delay or a small delay with respect to the system clock sysCLK.

However, the delay of the strobe signal DQS and the data DQ is almost determined depending on, for example, a board design, a power source, or other such conditions in many cases. That is, the interface circuit 213 of the Related Art 2 has a problem that the two synchronizing paths are being active all the time, so a circuit that is not so used consumes considerable power, and power consumption increases more than necessary.

Further, the interface circuit 213 of the Related Art 2 dynamically switches the synchronizing paths, so it is difficult to detect which synchronizing path is tested upon the circuit functional test for delivery inspection. That is, it is difficult to test the interface circuit 213 with reliability.

SUMMARY OF THE INVENTION

An interface circuit according to an aspect of the invention includes: a first synchronizing circuit for synchronizing a data signal that is synchronized with a strobe signal having a delay equal to or more than a predetermined period with respect to a reference clock, with the reference clock; a second synchronizing circuit for synchronizing a data signal that is synchronized with a strobe signal having a delay less than the predetermined period with respect to the reference clock, with the reference clock; a delay determining circuit for outputting a determination signal based on a result of measuring a delay of the strobe signal relative to the reference clock; a delay determination setting circuit for outputting a path setting signal that designates one of the first synchronizing circuit and the second synchronizing circuit based on a preset value; and a delay selecting circuit for selecting and outputting an output value of one of the first synchronizing circuit and the second synchronizing circuit based on one of the determination signal and the path setting signal.

According to the interface circuit of the present invention, an appropriate one of the first synchronizing circuit and the second synchronizing circuit can be designated based on a preset value, making it possible to easily grasp which one of the synchronizing circuits is used. Based on the above, an unused one of the synchronizing circuits is put into a suspend mode, whereby power consumption can be reduced more than the conventional interface circuit.

Further, the used synchronizing circuit can be switched by a delay determination setting circuit, so a circuit measurement precision can be improved upon the delivery inspection or other such testing. Thus, the circuit can be more accurately tested, so a reliability of the interface circuit can be improved.

Furthermore, a delay of strobe signal relative to the reference clock is measured by the delay determining circuit, and the synchronizing circuit to be used can be determined based on the measurement result. Thus, even if signals that are largely different in delay time with respect to the reference clock are input, the signals can be accurately synchronized with the reference clock.

BRIEF DESCRIPTION OF THE DRAWINGS

The above and other objects, advantages and features of the present invention will be more apparent from the following description taken in conjunction with the accompanying drawings, in which:

FIG. 8 is a block diagram of a system including an interface circuit of the Related Art.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
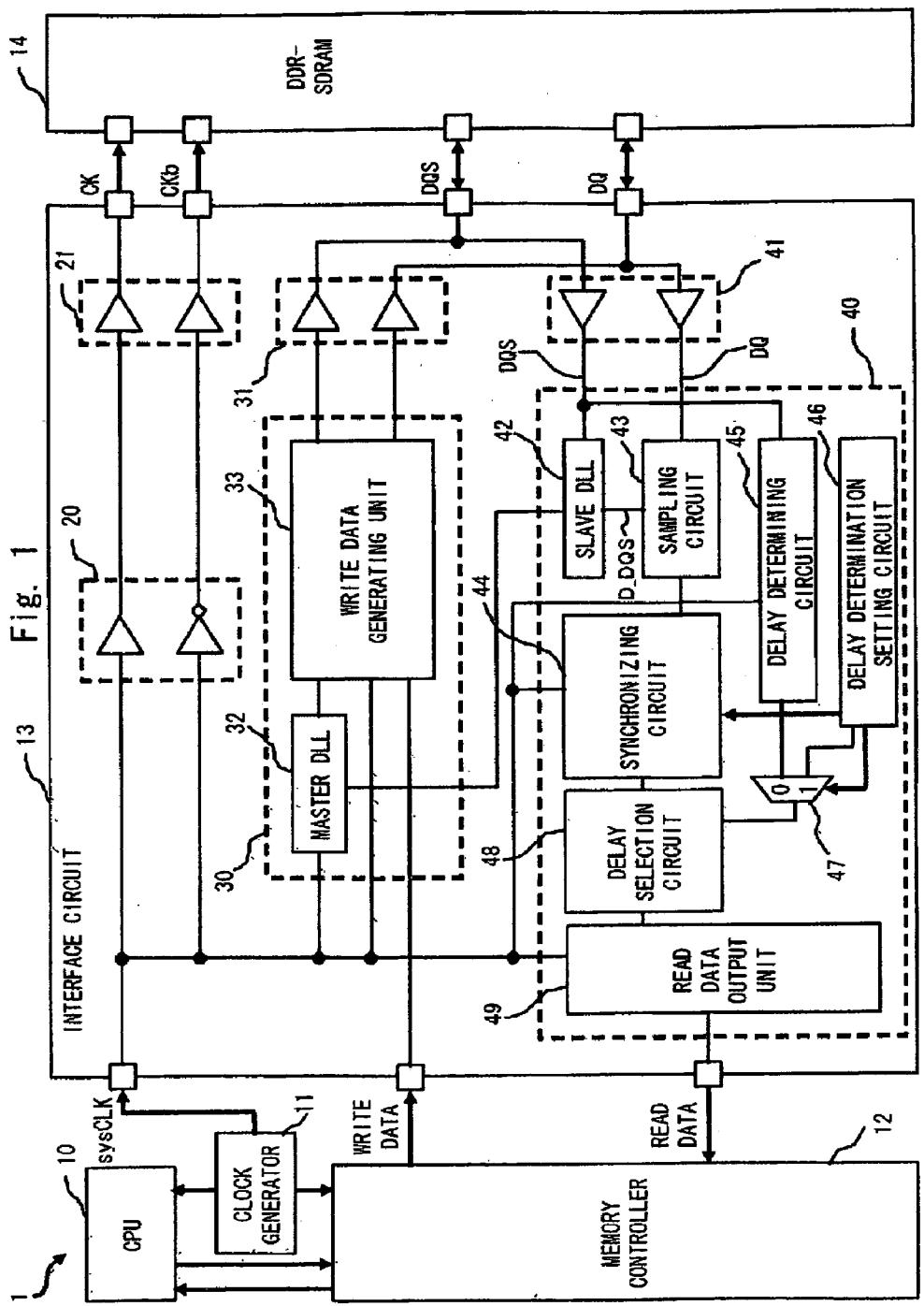
FIG. 1 is a block diagram of a system including an interface circuit according to a first embodiment of the present invention.

FIG. 1 is a block diagram showing a data processing system 1 including an interface circuit according to a first embodiment of the present invention. As shown in FIG. 1, the system 1 includes a CPU 10, a clock generator 11, a memory controller 12, an interface circuit 13, and a DDR-SDRAM 14. In the system 1, for example, the CPU 10, the clock generator 11, the memory controller 12, and the interface circuit 13 are mounted onto the same semiconductor substrate, and the DDR-SDRAM 14 is mounted onto a different semiconductor substrate.

Each block of the data processing system 1 operates in response to a reference clock (for example, system clock sysCLK) generated by the clock generator 11. The CPU 10 processes data based on a command of an application stored in a storage device or the like (not shown). Further, the CPU 10 transmits/receives data to/from the memory controller 12 and to/from the DDR-SDRAM 14 through the interface circuit 13 as needed. The memory controller 12, the interface circuit 13, and the DDR-SDRAM 14 are described later in detail.

The memory controller 12 controls an operation of reading/writing data from/to a memory based on a command from the CPU 10. Further, the memory controller 12 transmits/receives data to/from the CPU 10, and access a memory through the interface circuit 13.

The DDR-SDRAM 14 is a mobile SDRAM, for example, and operates in response to a clock CK and a clock CKb. In the case where the DDR-SDRAM 14 receives a data signal (for example, data DQ) from the interface circuit 13, the DDR-SDRAM 14 receives a signal that combines a strobe signal DQS and the data DQ. The strobe signal DQS is generated by the interface circuit 13 based on the system clock sysCLK and delayed with respect to the system clock sysCLK. For example, the strobe signal has a delay lag of 90° with respect to the system clock sysCLK. Further, the data DQ is a data signal synchronized with the system clock sysCLK. The DDR-SDRAM 14 receives the data DQ together with the strobe signal DQS to thereby latch and load the data DQ using the strobe signal DQS in a stable period where the data DQ is not changed. Further, in the case of transmitting the data DQ to the interface circuit 13, the DDR-SDRAM 14 sends the strobe signal DQS and the data DQ synchronized with the strobe signal DQS.

The interface circuit 13 receives the system clock sysCLK, and outputs a clock CK that is in phase with the system clock sysCLK and a clock CKb that is 180° out of phase with the system clock, toward the DDR-SDRAM 14 based on the system clock sysCLK.

In addition, the interface circuit 13 generates the strobe signal DQS having a phase lag from the system clock sysCLK based on the system clock sysCLK. Furthermore, the bit length of write data synchronized with the system clock sysCLK input from the memory controller 12 is converted into the bit length of received data of the DDR-SDRAM 14, and the converted data is sent to the DDR-SDRAM 14 as the data DQ.

In addition, if receiving the data DQ synchronized with the strobe signal DQS together with the strobe signal DQS from the DDR-SDRAM 14, the interface circuit 13 generates read data for which the signal synchronized with the data DQ is the system clock sysCLK instead of the strobe signal DQS to transmit the read data to the memory controller 12. That is, the interface circuit 13 executes arbitration between the DDR-SDRAM 14 and the memory controller 12.

Based on the above explanation, the interface circuit 13 of the data processing system 1 of this embodiment has a function of generating read data by synchronizing the data DQ asynchronous with the system clock sysCLK with the system clock sysCLK. That is, even if the data DQ from the DDR-SDRAM 14 is asynchronous with the system clock sysCLK, the memory controller 12 can receive the read data synchronized with the system clock sysCLK due to the arbitration of the interface circuit 13.

The interface circuit 13 is described in detail below. The interface circuit 13 includes a clock generating unit 20, a clock output buffer 21, a write data synchronizing unit 30, a data output buffer 31, a read data synchronizing unit 40, and a data input buffer 41.

The clock generating unit 20 includes a buffer circuit and an inverter. The buffer circuit generates a clock CK in phase of the system clock sysCLK, and the inverter generates a clock CKb in opposite phase with respect to the system clock sysCLK. The clock CK and the clock CKb are each output to the DDR-SRAM 14 through the clock output buffer 21.

The write data synchronizing unit 30 includes a master DLL (Delay Locked Loop) 32 and a write data generating unit 33. The master DLL 32 measures, for example, a period corresponding to one clock of the system clock sysCLK to generate the strobe signal DQS that is given a predetermined delay based on the measured period. For example, in the case of giving the phase lag of 90° from the system clock sysCLK to the strobe signal DQS, the master DLL may generate the strobe signal DQS based on ¼ of one clock period of the system clock sysCLK. Further, the master DLL sends information about a delay corresponding to a predetermined percentage of the measured one clock period to a slave DLL 42. Assuming that one clock period is 7.5 nsec, for example, the master DLL sends delay setting information about a delay corresponding to ¼ of the one clock period, i.e., 1.875 nsec to the slave DLL. The slave DLL is described later in detail.

The write data generating unit 33 converts 64-bit write data received from the memory controller 12 through a 64-bit bus into lower 32-bit data to be transmitted on the rising edge of the system clock sysCLK and upper 32-bit data to be transmitted on the falling edge of the system clock sysCLK. Further, the write data generating unit 33 is a circuit for adjusting the bit length if the bit length of data in the memory controller 12 is different from that in the DDR-SDRAM 14.

A signal from the write data synchronizing unit 30 is output to the DDR-SDRAM 14 through the data output buffer 31.

Figure 2:
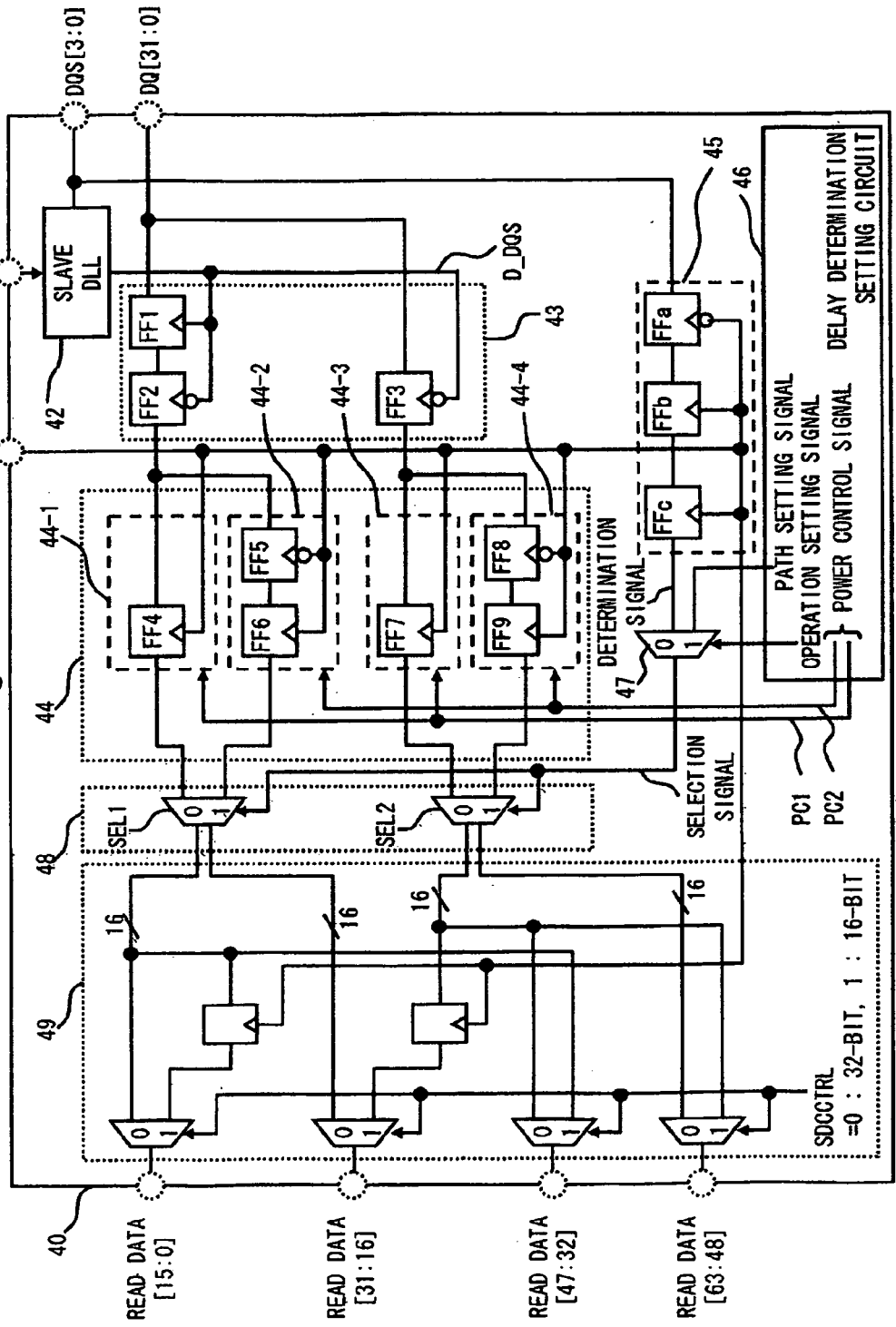
FIG. 2 is a block diagram of the system including the interface circuit of the first embodiment.

The read data synchronizing unit 40 receives the strobe signal DQS and the data DQ from the DDR-SDRAM 14 through the data input buffer 41. FIG. 2 is a block diagram of the read data synchronizing unit 40. Referring to FIG. 2, the read data synchronizing unit 40 is described.

The read data synchronizing unit 40 includes a slave DLL 42, a sampling circuit 43, a synchronizing circuit 44, a delay determining circuit 45, a delay determination setting circuit 46, a selector 47, a delay selecting circuit 48, and a read data output unit 49.

The slave DLL 42 outputs a delayed strobe signal D_DQS that is obtained by giving a predetermined delay to the strobe signal DQS based on delay setting information from the master DLL. For example, the slave DLL gives a phase lag of 90° to the input strobe signal DQS to generate and output the delayed strobe signal D_DQS.

The sampling circuit 43 has FFs (flip-flop circuits) 1 to 3, and the data DQ is input to the FF 1 and the FF 3. The FF 1 is series-connected with the FF 2. The FF 1 latches the data DQ on the rising edge of the delayed strobe signal D_DQS, and the FF 2 latches a signal from the FF 1 on the falling edge of the on the falling edge of the delayed strobe signal D_DQS. Hence, lower-bit data of the data DQ are sampled. In addition, the FF 3 samples upper-bit data of the data DQ by latching the data DQ on the falling edge of the delayed strobe signal D_DQS.

The synchronizing circuit 44 includes a first synchronizing circuit (for example, slow DQ paths 44-1 and 44-3), and a second synchronizing circuit (for example, fast DQ paths 44-2 and 44-4). The slow DQ paths 44-1 and 44-3 are circuits for synchronizing a data signal synchronous with the strobe signal having a delay equal to or more than a predetermined period with respect to the system clock sysCLK, with the reference clock. The fast DQ paths 44-2 and 44-4 are circuits for synchronizing a data signal synchronous with the strobe signal having a delay less than a predetermined period with respect to the system clock sysCLK, with the reference clock. Here, the term predetermined delay means that the strobe signal DQS has a phase lag of 180° from the system clock sysCLK, for example.

The slow DQ path 44-1 has the FF 4, and the slow DQ path 44-2 has the FF 7. The FFs 4 and 7 each latch a signal on the rising edge. The fast DQ path 44-2 has series-connected FFs 5 and 6, and the fast DQ path 44-4 has series-connected FFs 8 and 9. The FFs 5 and 8 each latch a signal on the falling edge of the system clock sysCLK, and the FFs 6 and 9 each latch a signal on the rising edge of the system clock sysCLK.

The FF 4 of the slow DQ path 44-1 and the FF 5 of the fast DQ path 44-2 are connected with an output of the FF 2 of the sampling circuit 43. That is, the slow DQ path 44-1 and the fast DQ path 44-2 are synchronizing circuits for lower bits of the data DQ. The FF 7 of the slow DQ path 44-3 and the FF 8 of the fast DQ path 44-4 are connected with an output of the FF 3 of the sampling circuit 43. That is, the slow DQ path 44-3 and the fast DQ path 44-4 are synchronizing circuits for upper bits of the data DQ.

In this case, a difference in operation between two slow DQ paths and two fast DQ paths is only that upper-bit or lower-bit data of the data DQ is synchronized, so the operation of the synchronizing circuit for upper-bit data (slow DQ path 44-3 and fast DQ path 44-4) is omitted here.

The FF 4 of the slow DQ path 44-1 latches an output signal of the FF 2 on the rising edge of the system clock sysCLK. As a result, the data DQ is synchronized with the system clock sysCLK. Further, the FF 5 of the fast DQ path 44-2 latches an output signal of the FF 3 on the falling edge of the system clock sysCLK, and the FF 6 latches an output signal of the FF 5 on the rising edge of the system clock sysCLK. As a result, the data DQ is synchronized with the system clock sysCLK.

The delay determining circuit 45 includes series-connected FFa to FFc. The delay determining circuit 45 outputs a determination signal based on a result of measuring a delay of the strobe signal relative to the system clock sysCLK. The determination is as follows: if a phase difference between the system clock sysCLK and the strobe signal DQS is less than 180°, for example, the delay is determined to be small, and the determination signal becomes "1". If the phase difference is 180° or more, the delay is determined to be large, and the determination signal becomes "0". In this example, if the determination signal is "0", the following delay selecting circuit 48 selects the slow DQ path. On the other hand, if the determination signal is "1", the delay selecting circuit 48 selects the fast DQ path. That is, the delay determining circuit 45 outputs a signal for dynamically switching paths by monitoring the strobe signal DQS using the system clock sysCLK.

The FFa is applied with the strobe signal DQS to latch the signal on the falling edge of the system clock sysCLK. The FFb is applied with an output signal of the FFa to latch the signal on the rising edge of the system clock sysCLK. The FFc is applied with an output signal of the FFb to latch the signal on the rising edge of the system clock sysCLK. Hence, the delay determining circuit 45 outputs "0" as the determination signal in the case where the delay of the input strobe signal DQS is large and outputs "1" as the determination signal in the case where the delay is small.

The delay determination setting circuit 46 outputs a path setting signal, an operation setting signal, and power control signals PC1 and PC2 based on a preset value. The path setting signal designates a path to be used of the synchronizing circuit 44 based on the preset value. The value may be set by a user, and can be set by predicting the delay of the strobe signal DQS relative to the system clock sysCLK, for example. That is, it is a signal for statically selecting a path of the synchronizing circuit 44. If the following selector 47 selects a path setting signal, the delay selecting circuit 48 selects and outputs an output signal of one of the slow DQ path and the fast DQ path based on the path setting signal. The operation setting signal is input to the selector 47 and the selector 47 uses this signal to select and output one of the path setting signal and the determination signal. The power control signal PC1 puts the slow DQ paths 44-1 and 44-3 into an active mode if the delay of the strobe signal DQS relative to the system clock sysCLK is large, and puts the slow DQ paths 44-1 and 44-3 into a suspend mode if the delay is small. The power control signal PC2 puts the fast DQ paths 44-2 and 44-4 into an active mode if the delay of the strobe signal DQS relative to the system clock sysCLK is small and puts the fast DQ paths 44-2 and 44-4 into a suspend mode if the delay is large.

The selector 47 selects one of the determination signal of the delay determining circuit 45 and the path setting signal of the delay determination setting circuit 46 based on the operation setting signal from the delay determination setting circuit 46 to output the selected one as a selection signal to the delay selecting circuit 48. For example, if the operation setting signal is "0", the determination signal of the delay determining circuit 45 is sent as the selection signal to the delay selecting circuit 48. If the operation setting signal is "1", the path setting signal of the delay determination setting circuit 46 is sent as the selection signal to the delay selecting circuit 48.

The delay selecting circuit 48 has selectors SEL1 and SEL2. The selector SEL1 selects an output signal of one of the slow DQ path 44-1 and the fast DQ path 44-2 based on the selection signal to output the signal to the read data output unit 49. The selector SEL2 selects an output signal of one of the slow DQ path 44-3 and the fast DQ path 44-4 based on the selection signal to output the signal to the read data output unit 49. If the selection signal is "0", for example, the selectors SEL1 and SEL2 select and output an output value of a corresponding slow DQ path. If the selection signal is "1", the selectors SEL1 and SEL2 select and output an output value of a corresponding fast DQ path.

The read data output unit 49 generates 32-bit or 16-bit read data using the data from the delay selecting circuit 48 based on a SDCCTRL signal to output the generated data to the memory controller 12.

Figure 3:
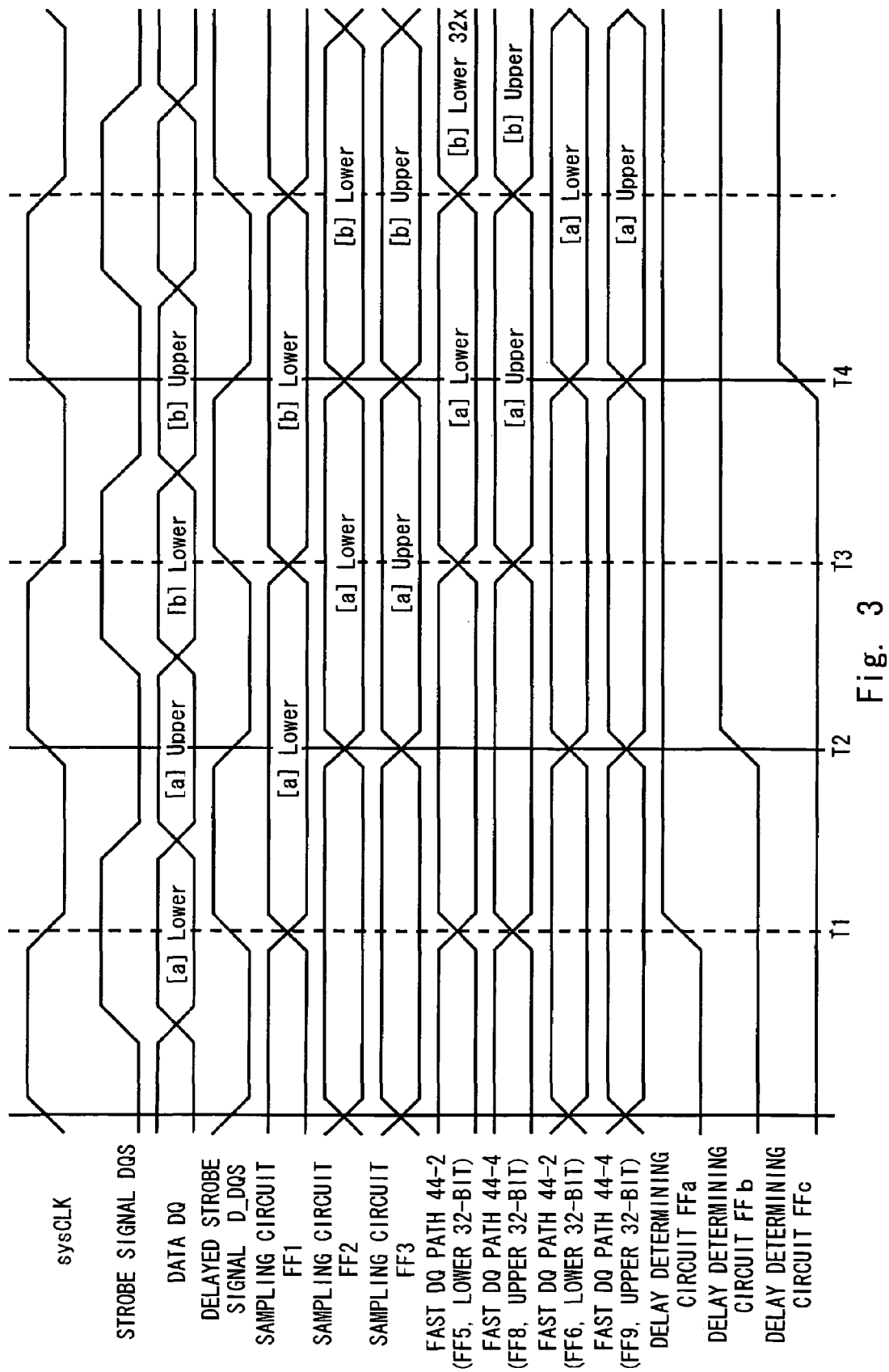
FIG. 3 is a timing chart of a read data synchronizing unit of the first embodiment.
Figure 4:
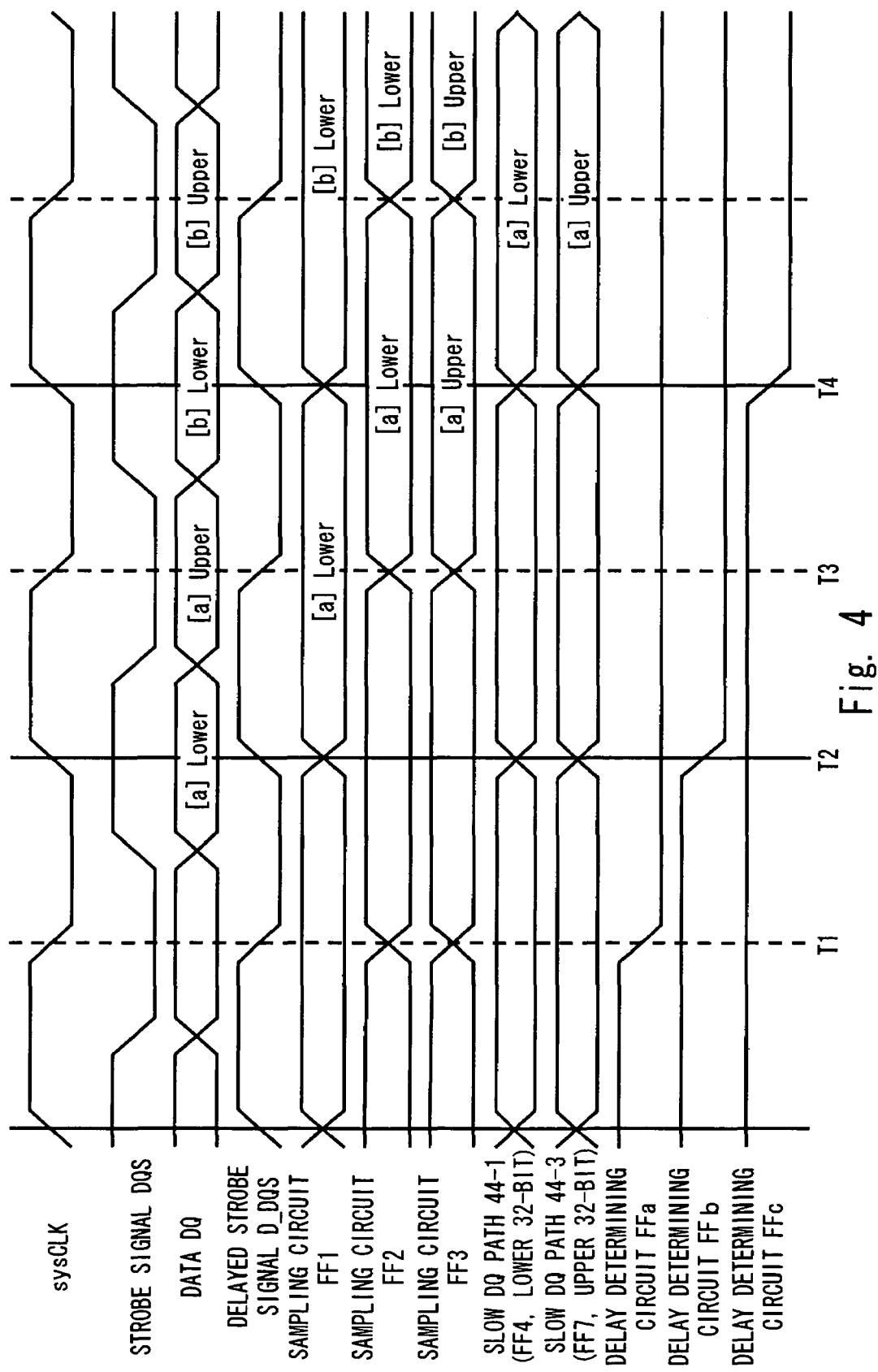
FIG. 4 is a timing chart of the read data synchronizing unit of the first embodiment.

FIGS. 3 and 4 are timing charts of an operation of the read data synchronizing unit 40. FIG. 3 is a timing chart in the case where the delay of the strobe signal DQS is small, and FIG. 4 is a timing chart in the case where the delay of the strobe signal DQS is large. Description is given now about an operation of the read data synchronizing unit 40 in the case of dynamically selecting a path to be used of the synchronizing circuit 44 based on the delay of the strobe signal DQS. That is, the operation setting signal of the delay determination setting circuit 46 is "0", and the selector 47 outputs the determination signal of the delay determining circuit 45 as the selection signal. Further, the power control signals PC1 and PC2 of the delay determination setting circuit 46 are used to set a corresponding path active.

Referring to FIG. 3, the operation for the small delay of the strobe signal DQS is first described. As shown in FIG. 3, the strobe signal DQS has a phase lag of 90° from the system clock sysCLK. When the strobe signal DQS and the data DQ are input to the read data synchronizing unit 40, the strobe signal DQS is further given a phase lag of 90° in the slave DLL 42, as the delayed strobe signal D_DQS.

At timing T1, the FF 1 of the sampling circuit 43 latches lower-bit data of the data DQ[a] on the rising edge of the delayed strobe signal D_DQS. Further, the FFa of the delay determining circuit 45 latches the strobe signal DQS of high level (for example, level of "1" in FIG. 2) on the falling edge of the system clock sysCLK.

At timing T2, the FF 2 of the sampling circuit 43 latches the lower-bit data of the data DQ[a] latched by the FF 1 on the falling edge of the delayed strobe signal D_DQS. At this time, the FF 3 of the sampling circuit 43 latches upper-bit data of the data DQ[a] on the falling edge of the delayed strobe signal D_DQS. In addition, the FFb of the delay determining circuit 45 latches the signal of high level latched by the FFa on the rising edge of the system clock sysCLK.

At timing T3, the FF 5 of the fast DQ path 44-2 latches the lower-bit data of the data DQ[a] latched by the FF 2 of the sampling circuit 43 on the falling edge of the system clock sysCLK. At this time, the FF 8 of the fast DQ path 44-4 latches the upper-bit data of the data DQ[a] latched by the FF 3 of the sampling circuit 43.

At timing T4, the FF 6 of the fast DQ path 44-2 latches the lower-bit data of the data DQ[a] latched by the FF 5 on the rising edge of the system clock sysCLK. At this time, the FF 9 of the fast DQ path 44-4 latches the upper-bit data of the data DQ[a] latched by the FF 8. The FFc of the delay determining circuit 45 latches the signal of high level latched by the FFb on the rising edge of the system clock sysCLK.

Since at timing T4, an output signal of the FFc is shifted to high level, the selector 47 sends "1" as the selection signal to the delay selecting circuit 48. As a result, the selectors SEL1 and SEL2 of the delay selecting circuit 48 select an output value of a corresponding fast DQ path. Accordingly, the data DQ[a] synchronous with the system clock sysCLK is output to the read data output unit 49.

Referring next to FIG. 4, the operation for the large delay of the strobe signal DQS is described. As shown in FIG. 4, the strobe signal DQS has a phase lag of 270° from the system clock sysCLK. When the strobe signal DQS and the data DQ are input to the read data synchronizing unit 40, the strobe signal DQS is further given a phase lag of 90° in the slave DLL 42, as the delayed strobe signal D_DQS.

At timing T1, the FFa of the delay determining circuit 45 latches the strobe signal DQS of low level (for example, level of "0" in FIG. 2) on the falling edge of the system clock sysCLK.

At timing T2, the FF 1 of the sampling circuit 43 latches lower-bit data of the data DQ[a] on the rising edge of the delayed strobe signal D_DQS. The FFb of the delay determining circuit 45 latches the signal of low level latched by the FFa on the rising edge of the system clock sysCLK.

At timing T3, the FF 2 of the sampling circuit 43 latches the lower-bit data of the data DQ[a] latched by the FF 1 on the falling edge of the delayed strobe signal D_DQS. At this time, the FF 3 of the sampling circuit 43 latches the upper-bit data of the data DQ[a] on the falling edge of the delayed strobe signal D_DQS.

At timing T4, the FF 4 of the slow DQ path 44-1 latches the lower-bit data of the data DQ[a] latched by the FF 2 of the sampling circuit 43 on the rising edge of the system clock sysCLK. At this time, the FF 7 of the slow DQ path 44-3 latches the upper-bit data of the data DQ[a] latched by the FF 3 of the sampling circuit 43. The FFc of the delay determining circuit 45 latches the signal of low level latched by the FFb on the rising edge of the system clock sysCLK.

Since at timing T4, an output signal of the FFc is shifted to low level, the selector 47 sends "0" as the selection signal to the delay selecting circuit 48. As a result, the selectors SEL1 and SEL2 of the delay selecting circuit 48 select an output signal of a corresponding slow DQ path. Accordingly, the data DQ[a] synchronous with the system clock sysCLK is output to the read data output unit 49.

The read data synchronizing unit 40 of this embodiment can statically select a path used in the synchronizing circuit 44 based on the settings of the delay determination setting circuit 46 in addition to the aforementioned dynamic selection of a path used in the synchronizing circuit 44. The static path selection is explained below.

In the case of statically selecting a path, the operation setting signal of the delay determination setting circuit 46 becomes "1", and the selector 47 outputs the path setting signal of the delay determination setting circuit 46. If the path setting signal is "0", the selectors SEL1 and SEL2 select a corresponding slow DQ path. At this time, the fast DQ path is not used, so the power control signal PC2 puts the fast DQ path into a suspend mode. If the path setting signal is "1", the selectors SEL1 and SEL2 select a corresponding fast DQ path. At this time, the slow DQ path is not used, so the power control signal PC1 brings the slow DQ path into a suspend mode.

As understood from the above, the interface circuit 13 of the first embodiment can not only dynamically select a path of the synchronizing circuit 44 based on the delay of the strobe signal DQS but also statically select a path of the synchronizing circuit 44 based on the settings of a register. Hence, a path of the synchronizing circuit 44 can be selected dynamically if the delay of the strobe signal DQS largely varies depending on the environment or other conditions and selected statically if the delay of the strobe signal DQS is small regardless of the environment or other conditions.

In the case of statically selecting a path of the synchronizing circuit 44, an unused path is put into a suspend mode, making it possible to reduce power consumption of the interface circuit 13 as compared with the conventional interface circuit. In most cases, the delay of the strobe signal DQS is determined based on the design of a board where a semiconductor device is mounted, or a set power supply voltage. Thus, in general, the delay does not largely vary. Accordingly, if the delay of the strobe signal DQS in the system is previously grasped, the interface circuit 13 can statically select and use a path of the synchronizing circuit 44.

Further, the interface circuit 13 of the first embodiment can dynamically select a path of the synchronizing circuit 44. The dynamic selection of the path of the synchronizing circuit 44 enables accurate transmission/reception of the data DQ in accordance with the circumstances even when the system is used, for example, in such an environment that a temperature difference is too large, with the result that the delay of the strobe signal DQS largely varies.

Furthermore, the interface circuit 13 of the first embodiment can dynamically and statically select a path of the synchronizing circuit 44. Thus, the interface circuit 13 can be mounted to a semiconductor device used under various conditions. For example, in the case of mounting the interface circuit to a semiconductor device intended for low power consumption, the interface circuit is set to statically select a path of the synchronizing circuit 44. Further, in the case of mounting the interface circuit to a semiconductor device used under various conditions, the interface circuit is set to dynamically select a path of the synchronizing circuit 44. Accordingly, the recycling efficiency of the interface circuit 13 of the first embodiment is high in terms of intellectual property.

On the other hand, the interface circuit 13 of the first embodiment enables high measurement precision upon the semiconductor device inspection such as the delivery inspection, so a reliability of the semiconductor device can be improved. That is, it is possible to determine which path is tested upon the semiconductor device inspection such as the delivery inspection. Hence, the testing can be accurately executed, and a reliability of the semiconductor device can be improved.

Second Embodiment

Figure 5:
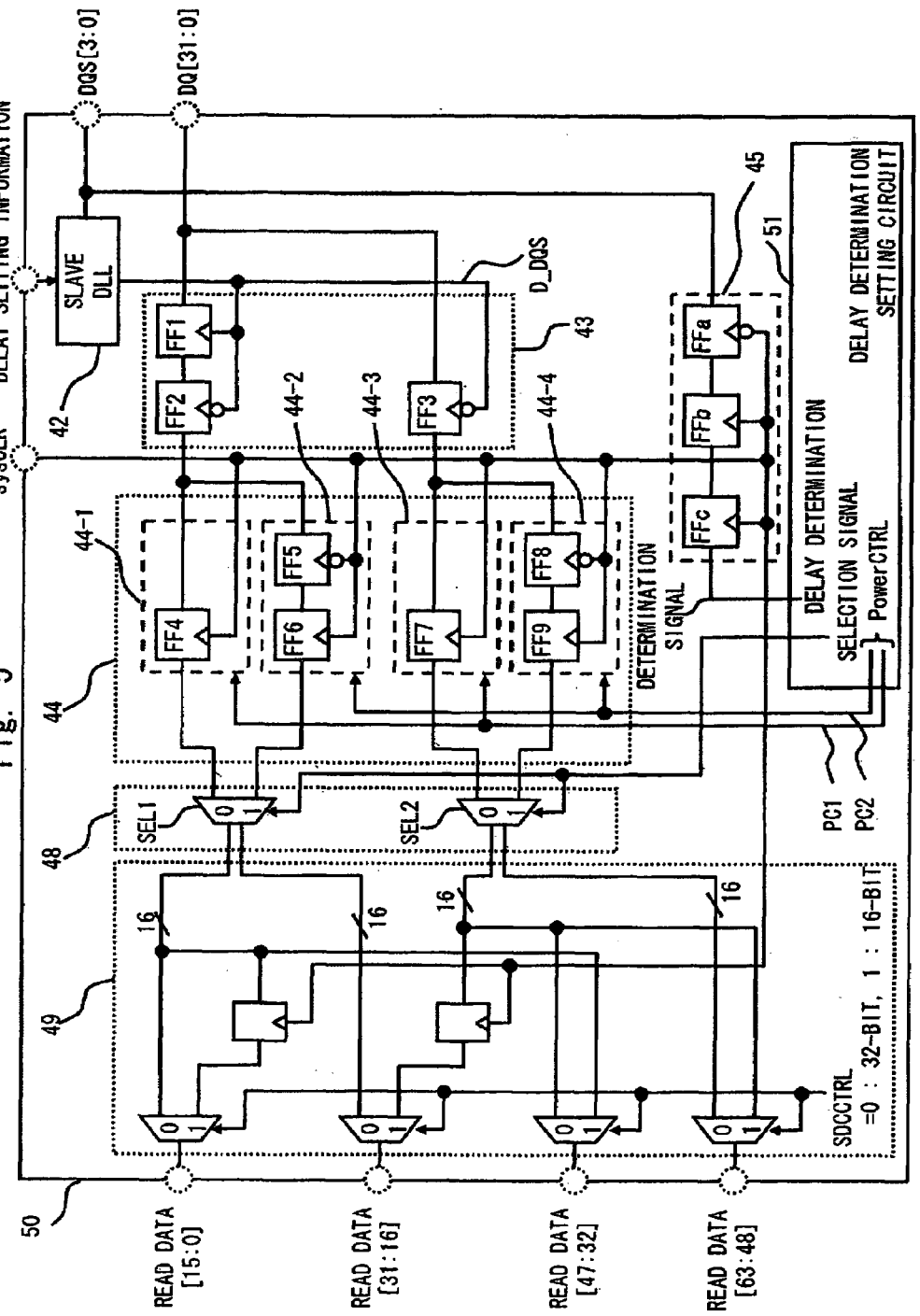
FIG. 5 is a block diagram of an interface circuit according to a second embodiment of the present invention.
Figure 6:
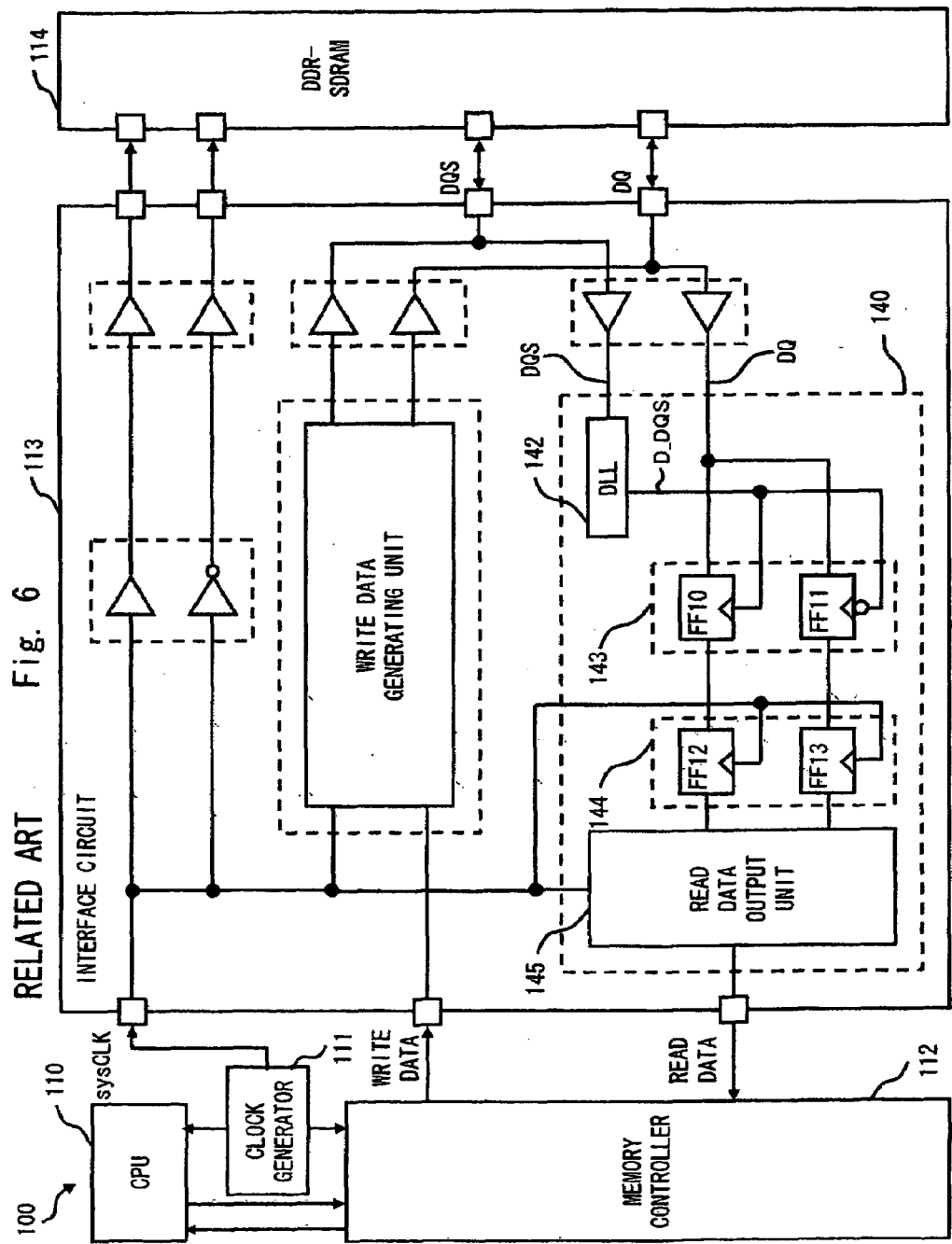
FIG. 6 is a block diagram of a system including an interface circuit of the Related Art.
Figure 7:
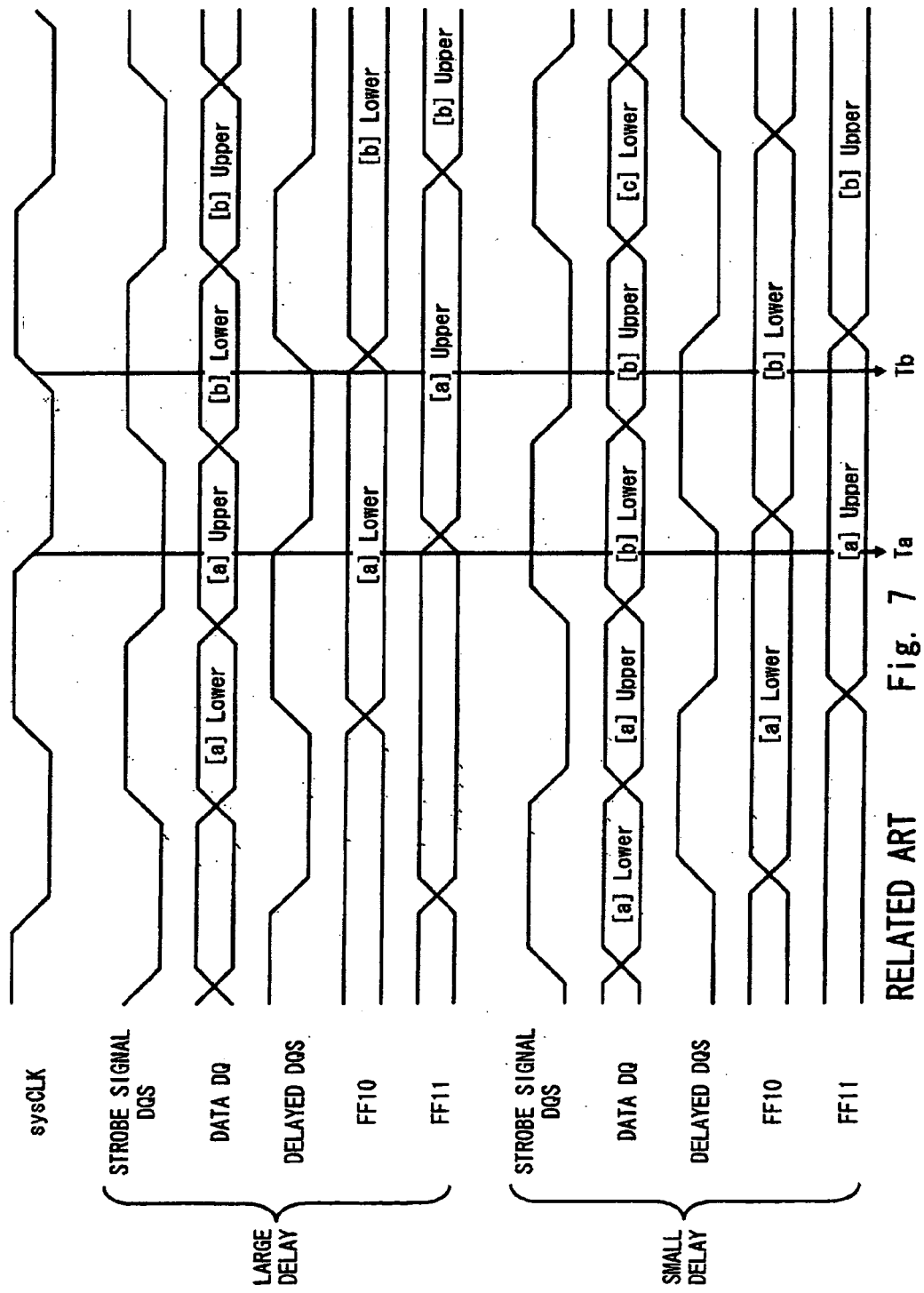
FIG. 7 is a timing chart of the interface circuit of the Related Art.

FIG. 5 shows a read data synchronizing unit 50 of an interface circuit according to a second embodiment of the present invention. The read data synchronizing unit 50 of the second embodiment is substantially the same circuit as the read data synchronizing unit 40 of the first embodiment. The read data synchronizing unit 40 of the first embodiment switches the static selection and the dynamic selection of a path of the synchronizing circuit 44 by means of the selector 47. In contrast, the read data synchronizing unit 50 of the second embodiment is structured such that the determination signal of the delay determining circuit 45 is input to the delay determination setting circuit 51, and the delay determination setting circuit 51 outputs a selection signal for selecting a path of the synchronizing circuit 44. The same components as those of the read data synchronizing unit 40 of the first embodiment are denoted by identical reference numerals, and description thereof is omitted here.

The delay determination setting circuit 51 of the second embodiment receives the determination signal of the delay determining circuit 45. Based on the determination signal of the delay determining circuit 45, the delay determination setting circuit 51 outputs the selection signal and the power control signals PC1 and PC2. The selection signal is similar to the determination signal of the delay determining circuit 45. Alternatively, the selection signal can switch between "0" and "1" based on the external settings, for example. The power control signal brings a path to be used into an active mode and brings an unused path into a suspend mode based on a value of the selection signal.

As understood from the above description, the interface circuit of the second embodiment can put an unused path into a suspend mode while dynamically selecting a path of the synchronizing circuit 44. Hence, power consumption can be saved at the time of dynamically selecting a path of the synchronizing circuit 44.

Further, the interface circuit of the second embodiment can also statically select a path of the synchronizing circuit 44, so the testing can be executed with high measurement precision. Accordingly, a reliability of the semiconductor can improve through the delivery inspection.

It is apparent that the present invention is not limited to the above embodiment that may be modified and changed without departing from the scope and spirit of the invention. For example, the present invention can switch between the dynamic path selection and the static path selection according to the circumstances when in use, and the synchronizing circuit and the sampling circuit are not limited to the above embodiments but may be modified as appropriate.

What is claimed is:

1. An interface circuit, comprising:
    a first synchronizing circuit for synchronizing a data signal that is synchronized with a strobe signal having a delay equal to or more than a predetermined period with respect to a reference clock, with the reference clock;
    a second synchronizing circuit for synchronizing a data signal that is synchronized with a strobe signal having a delay less than the predetermined period with respect to the reference clock, with the reference clock;
    a delay determining circuit for outputting a determination signal based on a result of measuring a delay of the strobe signal relative to the reference clock;
    a delay determination setting circuit for outputting a path setting signal that designates one of the first synchronizing circuit and the second synchronizing circuit based on a preset value; and
    a delay selecting circuit for selecting and outputting an output value of one of the first synchronizing circuit and the second synchronizing circuit based on one of the determination signal and the path setting signal.

2. The interface circuit according to claim 1, wherein the delay determination setting circuit further outputs a power control signal for putting an unused one of the first synchronizing circuit and the second synchronizing circuit into a suspend mode.

3. The interface circuit according to claim 1, wherein the delay determination setting circuit outputs a selection signal for setting which one of the first synchronizing circuit and the second synchronizing circuit is used based on the determination signal in place of the path setting signal.

4. The interface circuit according to claim 1, wherein a data signal synchronous with a strobe signal having a large delay relative to the reference clock synchronized by the first synchronizing circuit and a data signal synchronous with a strobe signal having a small delay relative to the reference clock synchronized by the second synchronizing circuit are output at substantially the same timing.

5. The interface circuit according to claim 1, wherein the delay determining circuit determines a delay of the strobe signal based on the reference clock.

6. The interface circuit according to claim 1, wherein the delay determining circuit determines that a delay is small if a phase difference between the strobe signal and the reference clock is less than 180° and that a delay is large if the phase difference is 180° or more.

7. The interface circuit according to claim 1, wherein the interface circuit, a CPU, and a memory controller are mounted onto the same semiconductor substrate.

8. The interface circuit according to claim 1, wherein the interface circuit is an interface connected with a memory controller and a DDR-SDRAM.

9. An interface circuit, comprising:
    a first synchronizing circuit for synchronizing a data signal that is synchronized with a strobe signal having a delay equal to or more than a predetermined period with respect to a reference clock, with the reference clock;
    a second synchronizing circuit for synchronizing a data signal that is synchronized with a strobe signal having a delay less than the predetermined period with respect to the reference clock, with the reference clock;
    a delay determining circuit for outputting a determination signal based on a result of measuring a delay of the strobe signal relative to the reference clock; and
    a delay selecting circuit for selecting and outputting an output value of one of the first synchronizing circuit and the second synchronizing circuit based on one of the determination signal and the path setting signal.

10. The interface circuit according to claim 9, further comprising:
    a delay determination setting circuit for outputting a path setting signal that designates one of the first synchronizing circuit and the second synchronizing circuit based on a preset value.

11. The interface circuit according to claim 9, wherein the delay determination setting circuit further outputs a power control signal for putting an unused one of the first synchronizing circuit and the second synchronizing circuit into a suspend node.

12. The interface circuit according to claim 9, wherein the delay determination setting circuit outputs a selection signal for setting which one of the first synchronizing circuit and the second synchronizing circuit is used based on the determination signal in place of the path setting signal.

13. The interface circuit according to claim 9, wherein a data signal synchronous with a strobe signal having a large delay relative to the reference clock synchronized by the first synchronizing circuit and a data signal synchronous with a strobe signal having a small delay relative to the reference clock synchronized by the second synchronizing circuit are output at substantially the same timing.

14. The interface circuit according to claim 9, wherein the delay determining circuit determines a delay of the strobe signal based on the reference clock.

15. The interface circuit according to claim 9, wherein the delay determining circuit determines that a delay is small if a phase difference between the strobe signal and the reference clock is less than 180° and that a delay is large if the phase difference is 180° or more.

16. The interface circuit according to claim 9, wherein the interface circuit, a CPU, and a memory controller are mounted onto the same semiconductor substrate.

17. The interface circuit according to claim 9, wherein the interface circuit is an interface connected with a memory controller and a DDR-SDRAM.

* * * * *